United States Patent
Ueno et al.

(10) Patent No.: US 7,952,147 B2
(45) Date of Patent: May 31, 2011

(54) SEMICONDUCTOR DEVICE HAVING ANALOG TRANSISTOR WITH IMPROVED OPERATING AND FLICKER NOISE CHARACTERISTICS AND METHOD OF MAKING SAME

(75) Inventors: Tetsuji Ueno, Suwon-si (KR); Hwa-sung Rhee, Seongnam-si (KR); Ho Lee, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 219 days.

(21) Appl. No.: 11/802,281

(22) Filed: May 22, 2007

(65) Prior Publication Data

US 2008/0036006 A1 Feb. 14, 2008

(30) Foreign Application Priority Data

May 22, 2006 (KR) .................. 10-2006-0045709

(51) Int. Cl.
*H01L 21/70* (2006.01)
(52) U.S. Cl. ........ 257/369; 257/351; 257/206; 257/350; 257/E21.611
(58) Field of Classification Search .................. 257/369, 257/351, 206, 350, E21.611
See application file for complete search history.

(56) References Cited

U.S. PATENT DOCUMENTS

| 6,906,393 B2 * | 6/2005 | Sayama et al. | |
| 2005/0196926 A1 | 9/2005 | Hanafi et al. | |
| 2005/0245034 A1 * | 11/2005 | Fukuda et al. | 438/285 |
| 2005/0260806 A1 * | 11/2005 | Chang et al. | 438/197 |
| 2005/0285187 A1 | 12/2005 | Bryant et al. | |
| 2006/0011984 A1 * | 1/2006 | Currie | |
| 2006/0105106 A1 * | 5/2006 | Balseanu et al. | 427/248.1 |
| 2007/0238250 A1 * | 10/2007 | Zhang et al. | 438/262 |
| 2007/0249113 A1 * | 10/2007 | Grudowski et al. | 438/199 |

FOREIGN PATENT DOCUMENTS

| CN | 1429055 A | * | 7/2003 |
| CN | 1505839 A | * | 6/2004 |
| JP | 2006-013082 | | 1/2006 |
| JP | 2006-024784 | | 1/2006 |
| KR | 1020050096386 A | | 10/2005 |

OTHER PUBLICATIONS

Dharmadhikari, V., et al.; "UV-assisted processing for advanced dielectric films", Solid State Technology, Mar. 2005.*
Taiwan Intellectual Property Office, Office Action dated Oct. 29, 2010.

* cited by examiner

*Primary Examiner* — Jerome Jackson, Jr.
*Assistant Examiner* — Dale Page
(74) *Attorney, Agent, or Firm* — Volentine & Whitt, PLLC

(57) ABSTRACT

A semiconductor device with improved transistor operating and flicker noise characteristics includes a substrate, an analog NMOS transistor and a compressively-strained-channel analog PMOS transistor disposed on the substrate. The device also includes a first etch stop liner (ESL) and a second ESL which respectively cover the NMOS transistor and the PMOS transistor. The relative measurement of flicker noise power of the NMOS and PMOS transistors to flicker noise power of reference unstrained-channel analog NMOS and PMOS transistors at a frequency of 500 Hz is less than 1.

12 Claims, 13 Drawing Sheets

SEMICONDUCTOR DEVICE HAVING ANALOG TRANSISTOR WITH IMPROVED OPERATING AND FLICKER NOISE CHARACTERISTICS AND METHOD OF MAKING SAME

BACKGROUND OF THE INVENTION

1. Field of the Invention

Embodiments of the present invention relate to a semiconductor device and a method of fabrication and more particularly to a semiconductor device with improved flicker noise characteristics.

This U.S. non-provisional patent application claims priority under 35 U.S.C §119 of Korean Patent Application 10-2006-0045709 filed on May 22, 2006 the entire contents of which are hereby incorporated by reference.

2. Discussion of Related Art

Device sizes are becoming smaller and smaller in today's semiconductor manufacturing processes. Because of these size reductions, methods of enhancing the mobility of electrons and holes are being developed. One such method induces strain in channel regions of the semiconductor device. However, strained analog MOS transistors tend to exhibit deteriorating flicker noise characteristics. Even though straining technology may have the ability to enhance the mutual conductance and cut-off frequency characteristics of analog MOS transistors, it may not be the most effective method to enhance the mobility of electrons and holes. In particular, in the case of large-scale integrated circuits (LSI) which comprise both digital and analog MOS transistors to provide completely integrated functions, it may be inappropriate to apply straining technology to both digital MOS transistors and analog MOS transistors at the same time. Accordingly, there is a need for a semiconductor device that can achieve synergies by improving both operating and noise characteristics.

SUMMARY OF THE INVENTION

Exemplary embodiments of the present invention are directed to a semiconductor device having a substrate, an analog NMOS transistor disposed on the substrate and a compressively-strained-channel analog PMOS transistor disposed on the substrate. A first etch stop liner (ESL) covers the NMOS transistor and a second ESL covers the PMOS transistor, wherein the relative measurements of flicker noise power associated with the NMOS and PMOS transistors as compared to flicker noise power of a reference unstrained-channel analog NMOS and PMOS transistors, respectively at a frequency of 500 Hz is less than 1.

DETAILED DESCRIPTION OF THE INVENTION

Figure 1:
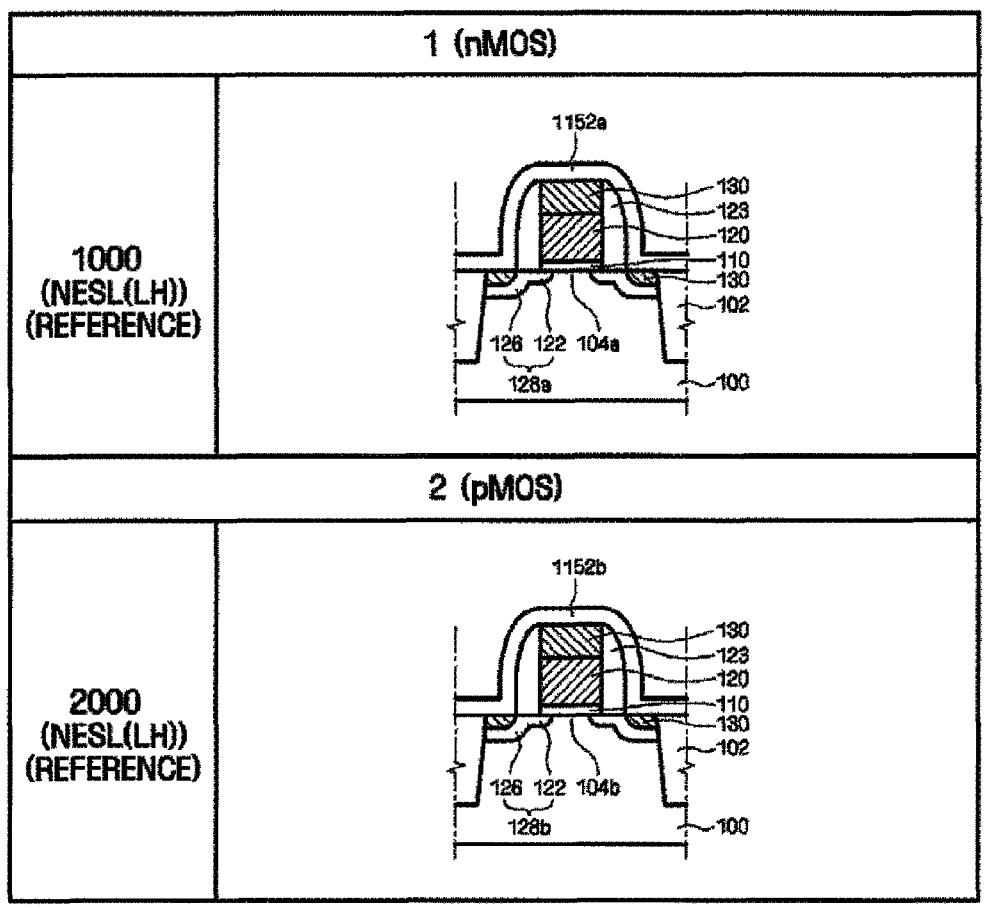
FIG. 1 illustrates cross-sectional views of reference unstrained-channel analog MOS transistors which are used to evaluate the noise power characteristics of analog MOS transistors according to embodiments of the present invention.

The present invention will now be described more fully with reference to the accompanying drawings, in which preferred embodiments of the invention are shown. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
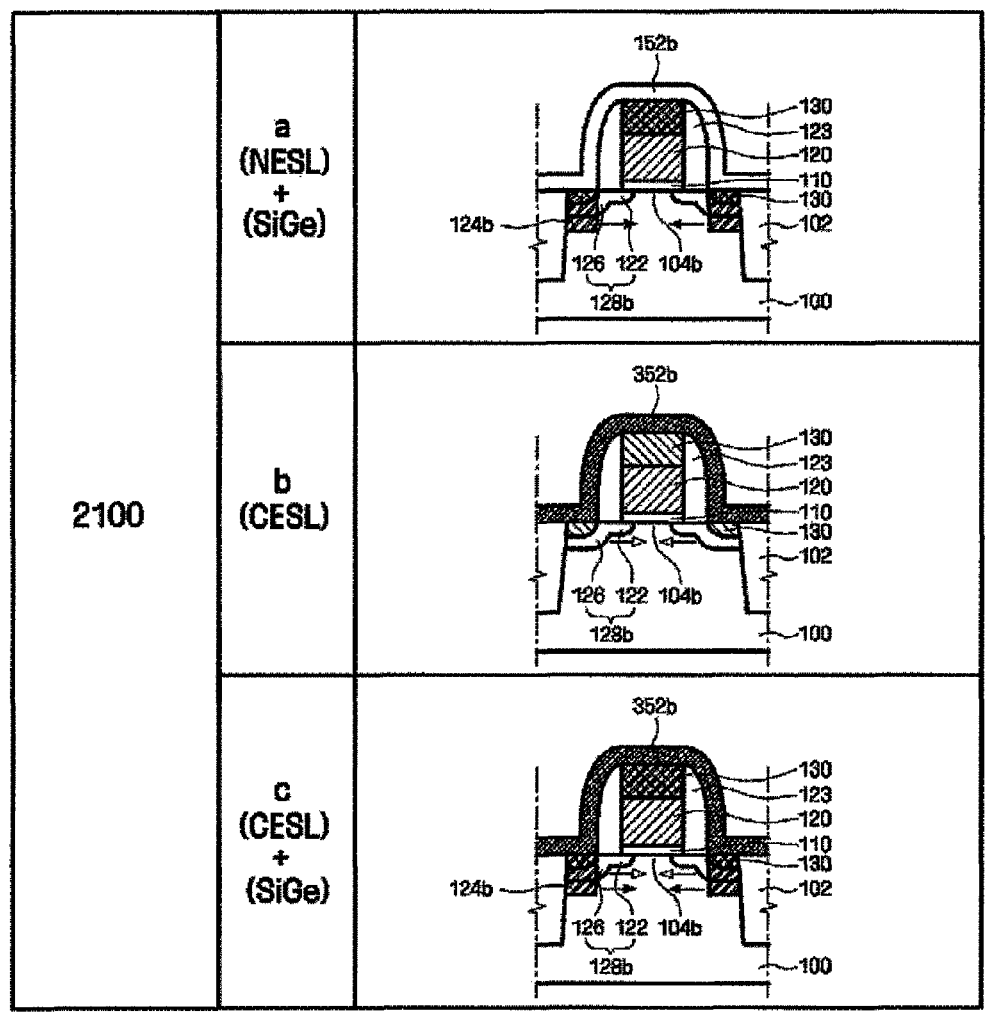
FIG. 2 illustrates cross-sectional views of compressively-strained-channel analog PMOS transistors of a semiconductor device according to an embodiment of the present invention.
Figure 3:
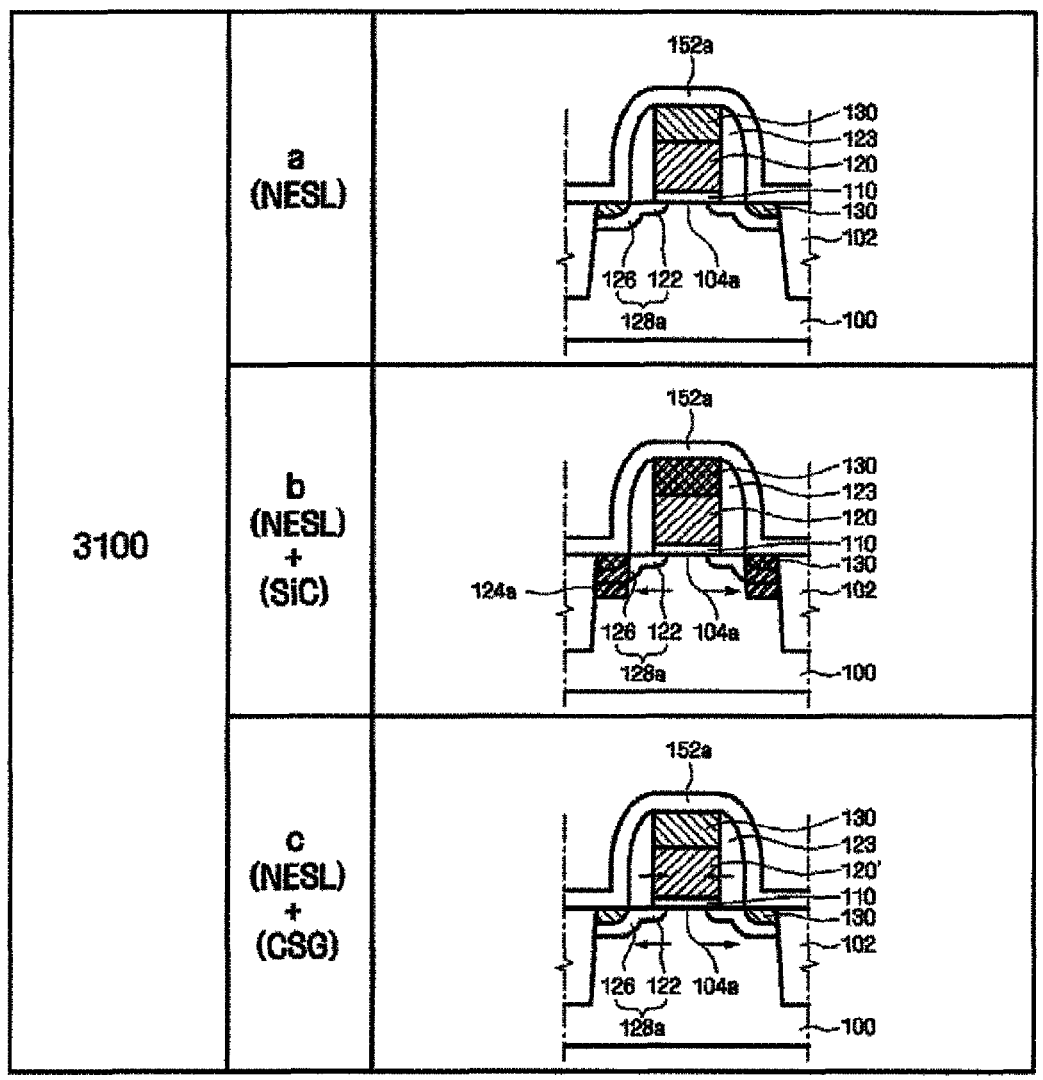
FIGS. 3-5 illustrate cross-sectional views of analog NMOS transistors of semiconductor devices according to embodiments of the present invention.
Figure 4:
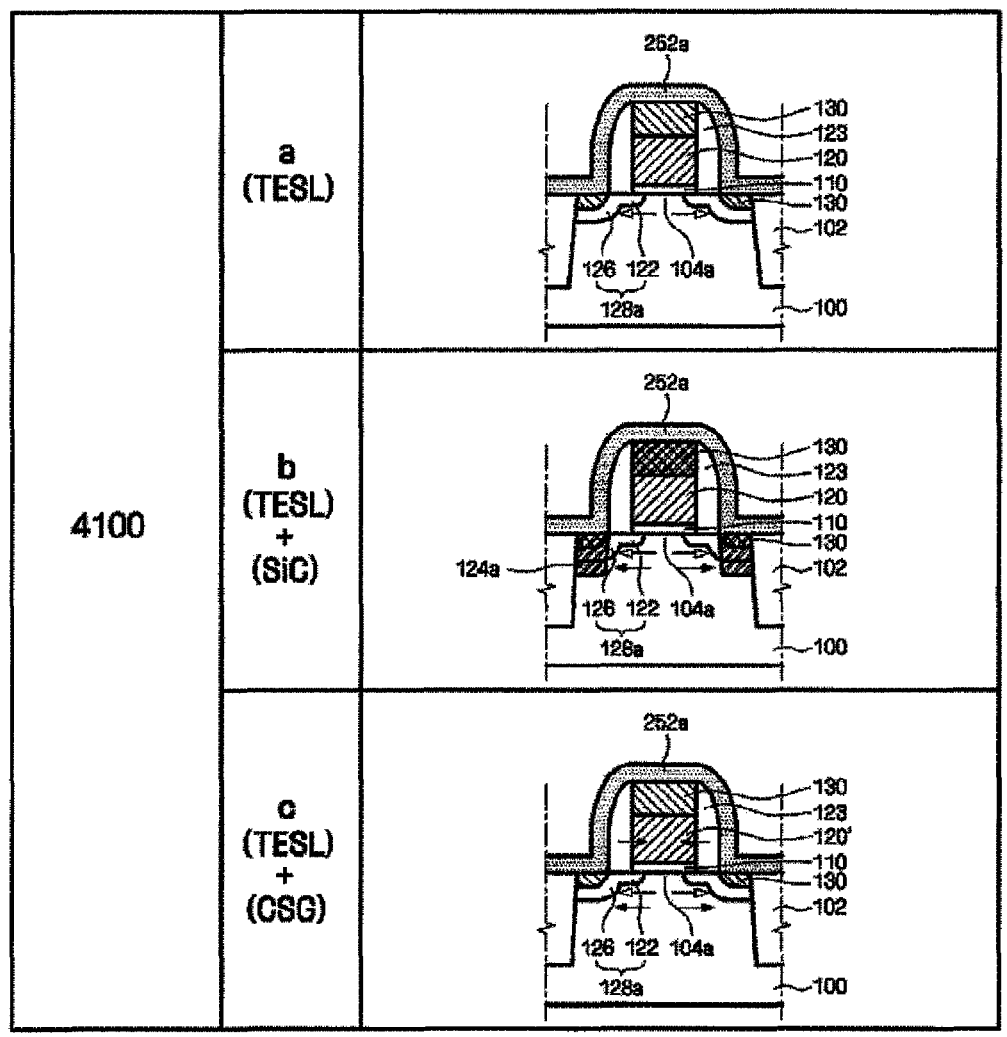
Figure 5:
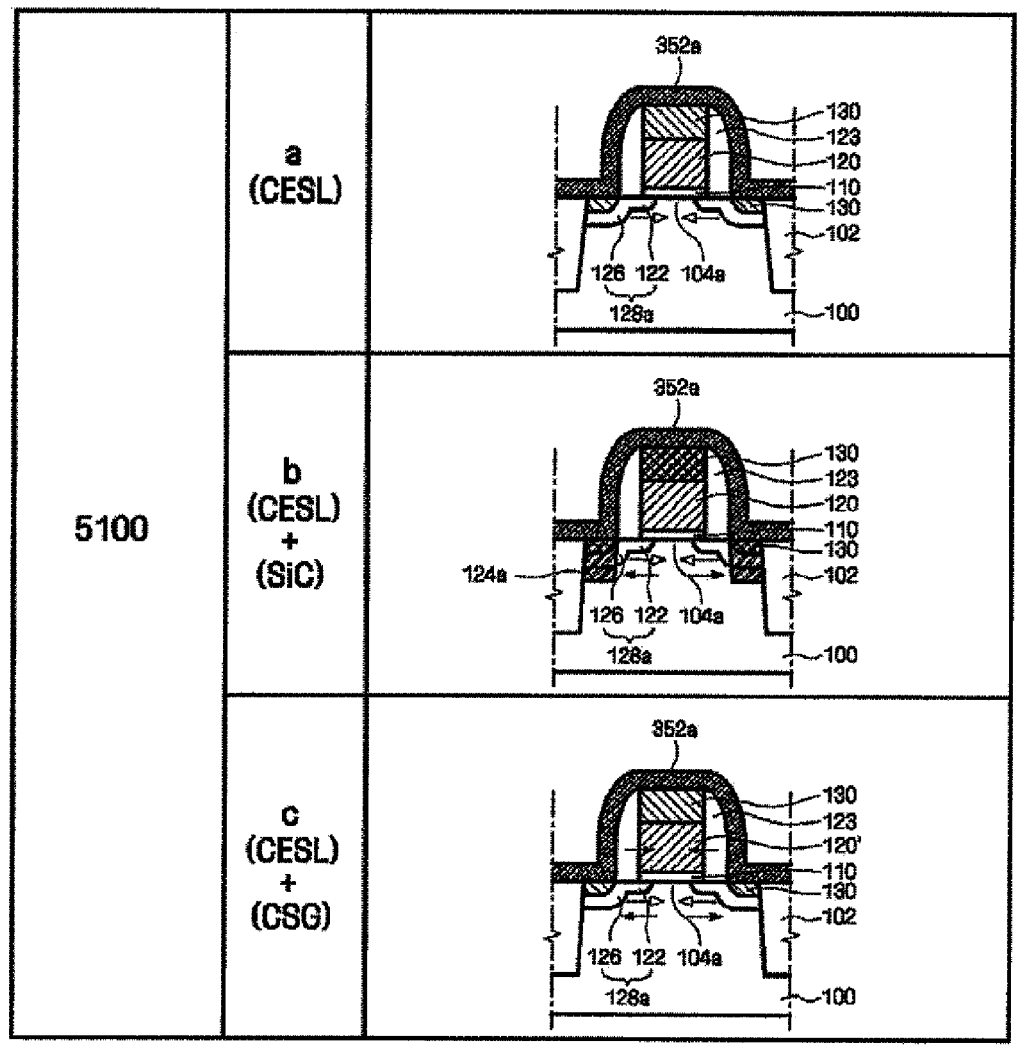

FIGS. 1-5 illustrate schematic views of semiconductor devices that include various combinations of strained-channel analog PMOS transistors 2100 of (FIG. 2) and strained or unstrained channel analog NMOS transistors 3100, 4100, and 5100 (FIGS. 3-5). Strained channels are obtained by applying compressive or tensile stress to typical channels so that the mobility μ of carriers (electrons or holes) can be changed. The relative measurement of the flicker (1/f) noise power (Svg (V2/Hz)) at a frequency of 500 Hz of PMOS transistors 2100 as compared to the flicker noise power, at the same frequency of a reference unstrained-channel analog PMOS transistor 2000 is less than 1. Similarly, the relative measurements of flicker noise power at the frequency of 500 Hz of NMOS transistors 3100, 4100, and 5100 as compared to the flicker noise power at the same frequency of a reference unstrained-channel analog NMOS transistor 1000 is also less than 1. Thus, the flicker noise characteristics of the PMOS transistors 2100 and NMOS transistors 3100, 4100, and 5100 are not less than the flicker noise characteristics of the reference unstrained-channel analog PMOS transistor 200 and NMOS transistor 1000.

The reference unstrained-channel analog MOS transistors 1000 and 2000 have the same design rule as and are formed of the same material as PMOS transistors 2100 and NMOS transistors 3100, 4100, and 5100. The reference unstrained-channel analog transistors 1000 and 2000 are MOS transistors with channels that are not strain-induced. That is, the reference unstrained-channel analog MOS transistors 1000 and 2000 shown in FIG. 1 induce a stress of less than ±|2| Gdyne/cm$^2$ or do not induce any stress in the channels. Etch stop liners (ELSs) 1152a and 1152b may be neutral ELSs (NESLs) which induce a stress of less than ±|2| Gdyne/cm$^2$ and may have a hydrogen concentration of less than $1 \times 10^{22}$/cm$^3$, and specifically less than $1 \times 10^{21}$/cm$^3$.

The strained-channel analog NMOS transistors 3100 (FIG. 3), 4100 (FIG. 4), and 5100 (FIG. 5) and the reference unstrained-channel analog NMOS transistor 1000 (FIG. 1) may include a substrate 100, shallow trench isolations (STI) 102 which are thinly formed in substrate 100, n-type source/drain regions 128*a* formed in an active region defined by STIs 102, and a channel region 104*a* formed between the n-type source/drain regions 128*a*. The NMOS transistors further include a gate 120 formed on channel region 104*a*, a gate insulation layer 110 interposed between substrate 100 and gate 120, and spacers 123 formed on the sidewalls of gate 120. A metal silicide layer 130 may be formed on gate 120 and/or in the n-type source/drain regions 128*a*, respectively.

Likewise, the strained-channel analog PMOS transistors 2100 and the reference unstrained-channel analog PMOS transistor 2000 may include a substrate 100, STIs 102 which are thinly formed in substrate 100, p-type source/drain regions 128*b* formed in an active region defined by STIs 102, and channel region 104*b* formed between the p-type source/drain regions 128*b*. The PMOS transistors further include a gate 120 formed on channel region 104*b*, a gate insulation layer 110 interposed between substrate 100 and gate 120, and spacers 123 formed on the sidewalls of gate 120. A metal silicide layer 130 may be formed on gate 120 and/or in the p-type source/drain regions 128*b*, respectively.

The NMOS transistors 3100, 4100, and 5100 respectively include first ESLs 152*a*, 252*a*, and 352*a* that cover the respective gates 120 and the respective spacers 123, and extend along the top surfaces of substrates 100. The PMOS transistors 2100 may include a second ESL 152*b* or 352*b* (shown in FIG. 2) that cover the respective gates 120, spacers 123 and extend along the top surfaces of substrates 100. As the integration density of semiconductor devices increases, the distance between transistors and the associated design rule decrease considerably thereby decreasing associated contact regions. The first ESLs 152*a*, 252*a*, and 352*a* and second ESLs 152*b* and 352*b* are formed in order to prevent an etching margin from being reduced during etching operation when forming contact holes. The PMOS transistors 2100 and the NMOS transistors 3100, 4100, and 5100 are designed based on the discovery that 1/f noise is considerably affected by the hydrogen concentration of ESLs in an analog NMOS transistor or the level of compressive strain induced in channels in an analog PMOS transistor as shown in FIGS. 6-11.

Figure 6:
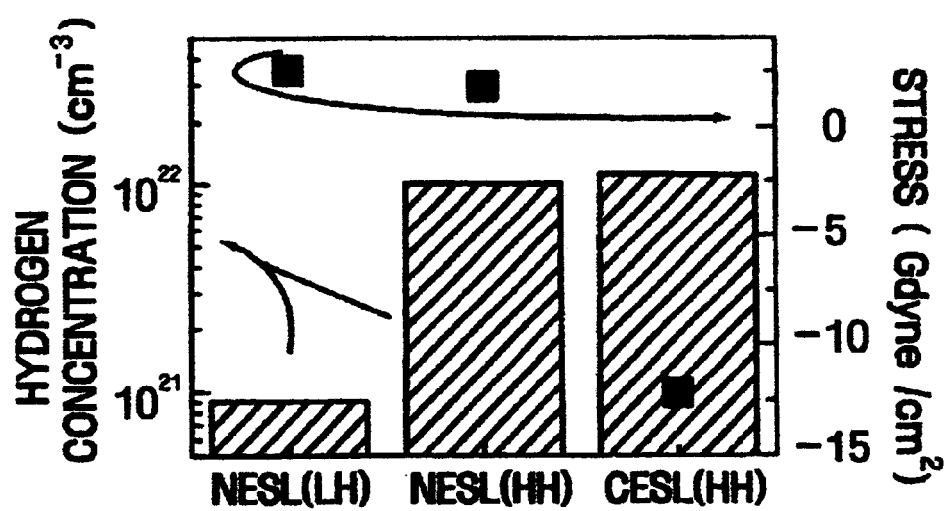
FIG. 6 illustrates a graph of a relationship between stress measurements and hydrogen concentration measurements of SiON layers formed using a plasma enhanced chemical vapor deposition (CVD) method.

The 1/f noise power Svg is mainly affected by interface-state density and carrier scattering, as identified by Equation (1):

$$S_{vg}(f) = \frac{kTq^2}{\gamma f W L C_{ox}^2}(1+\alpha\mu N)^2 N_t(E_{fn}) \qquad (1)$$

where Svg indicates noise power, $N_t$ indicates interface-state density, $\mu$ indicates mobility, N indicates carrier density, and $\alpha$ indicates a scattering coefficient. Experimental results shown in FIGS. 6-11 indicate that stress reduces noise power; and that an increase in interface-state density results in an increase in noise power. In particular, FIG. 6 illustrates a graph of stress measurements and hydrogen concentration of SiON layers formed using a plasma enhanced chemical vapor deposition (PECVD) method. A neutral etch stop liner (NESL) with a low hydrogen concentration of $1\times10^{21}/cm^3$ and an NESL with a high hydrogen concentration of $1\times10^{22}/cm^3$ both exhibit a stress of about 2 Gdyne/cm². This is compared with a compressive ESL (CESL) with a high hydrogen concentration of $1\times10^{21}/cm^3$ exhibits a stress of about −12 Gdyne/cm².

Figure 7:
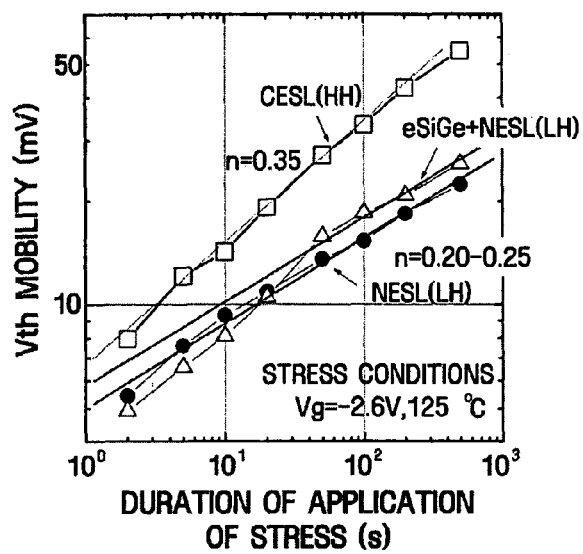
FIGS. 7-11 present experimental data for determining the factors that influence flicker noise.

FIG. 7 illustrates a graph of negative bias temperature instability (NBTI) measurements of analog PMOS transistors (NESL(LH)) comprising an NESL with a low hydrogen concentration, NBTI measurements of analog PMOS transistors (CESL(HH)) comprising a CESL with a high hydrogen concentration which induces compressive strain in a channel, NBTI measurements of analog PMOS transistors eSiGe+NESL(LH) comprising an NESL with a low hydrogen concentration and an epitaxial SiGe (eSiGe) layer which fills a groove in a substrate and includes source/drain regions. The CESL with a high hydrogen concentration induces compressive strain in a channel. The analog PMOS transistors that produce the experimental results illustrated in FIG. 7 were formed of the same material and pursuant to the same design rule. As can be seen from the graph, the analog PMOS transistors eSiGe+NESL(LH) exhibit substantially the same NBTI characteristics as the analog PMOS transistors NESL(LH). In addition, the analog PMOS transistors CESL(HH) exhibit different NBTI characteristics from the analog PMOS transistors NESL(LH).

Figure 8:
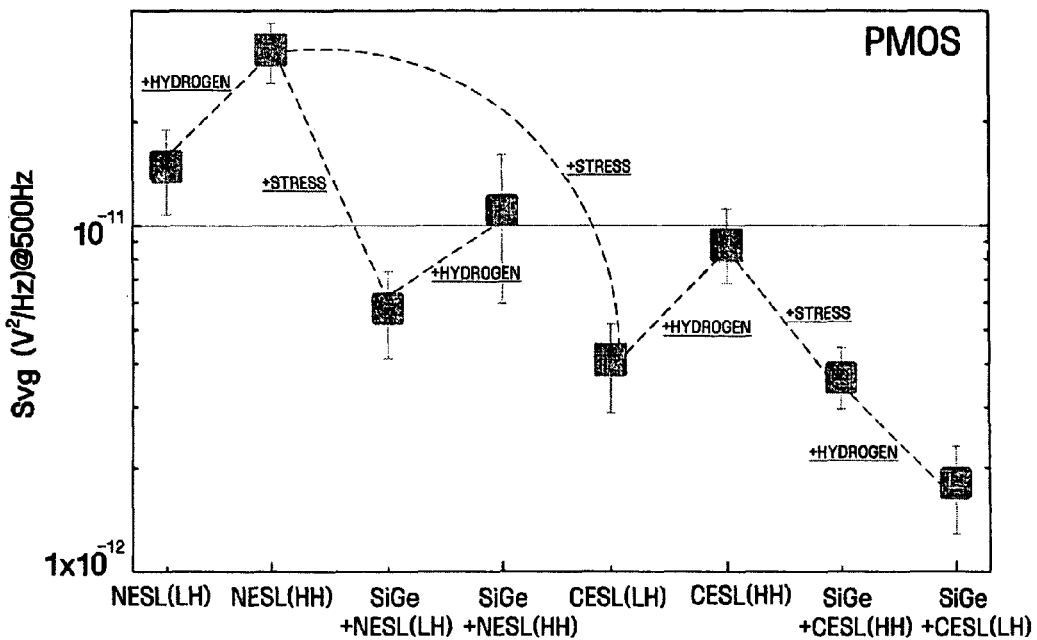

FIG. 8 illustrates a graph between noise power measurements for various transistor types at a frequency of 500 Hz. In particular, a noise power measurement is shown for an analog PMOS transistor NESL(LH) comprising an NESL with a low hydrogen concentration and a noise power measurement for an analog PMOS transistor NESL(HH) comprising an NESL with a high hydrogen concentration. Noise power measurements of analog PMOS transistor SiGe+NESL(LH) comprising an eSiGe layer and an NESL with a low hydrogen concentration and for an analog PMOS transistor SiGe+NESL (HH) comprising an eSiGe layer and an NESL with a high hydrogen concentration are also shown. Further, noise power measurements are shown for an analog PMOS transistor CESL(LH) comprising a CESL with a low hydrogen concentration and for an analog PMOS transistor CESL(HH) comprising a CESL with a high hydrogen concentration. Noise power measurements are also provided for an analog PMOS transistor SiGe+CESL(LH' comprising an eSiGe layer and a CESL with a low hydrogen concentration and for an analog PMOS transistor SiGe+CESL(HH) comprising an eSiGe layer and a CESL with a high hydrogen concentration.

The analog PMOS transistor SiGe+NESL(LH) referred to in FIG. 8 is determined (based on the experimental results illustrated in FIG. 7) to have substantially the same NBTI characteristics as the analog PMOS transistor NESL(HL), but has a much lower noise power level than the analog PMOS transistor NESL(HL). Since eSiGe comprises no hydrogen, it's concluded that compressive strain induced by eSiGe positively affects the noise characteristics of a PMOS transistor. That is, compressive strain reduces the noise power of a PMOS transistor by reducing carrier mass so that a scattering coefficient can be reduced. In addition, given that the noise power levels of the analog PMOS transistors NESL(HH) and CESL(HH) are almost twice as high as the noise power levels of the analog PMOS transistors NESL(LH) and CESL(LH), respectively, it can be concluded that an increase in interface-state density caused by hydrogen results in an increase in noise power. Given that the analog PMOS transistor CESL (HH) has slightly improved noise characteristics over the analog PMOS transistor NESL(LH), it can be concluded that compressive strain can compensate for a deterioration in noise characteristics caused by hydrogen and may slightly improve noise characteristics. In this manner, even though the noise characteristics of an analog PMOS transistor is adversely affected by the hydrogen concentration of an ESL, it is possible to prevent the noise characteristics of an analog PMOS transistor from deteriorating further by inducing an appropriate level of compressive strain.

Figure 9:
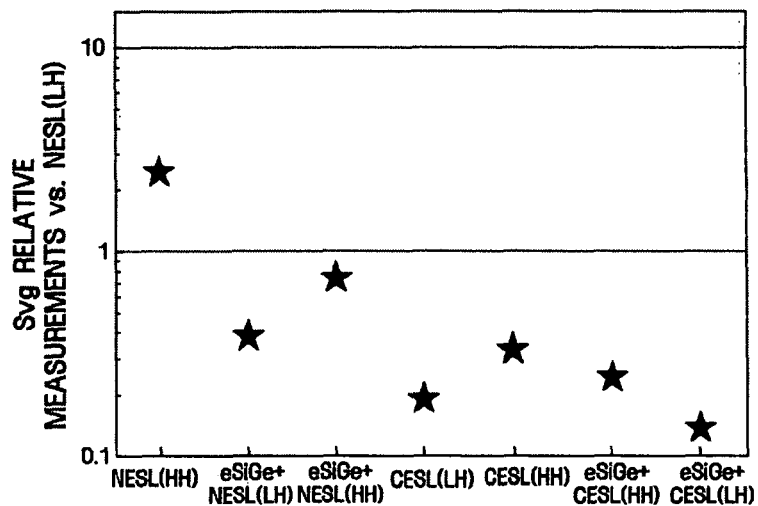

FIG. 9 illustrates a graph of a relationship between the relative measurements of the noise power measurements of the analog PMOS transistors 'NESL(HH)', 'eSiGe+NESL (LH)', 'eSiGE+NESL(HH)', 'CESL(LH)', 'CESL(HH)', 'eSiGe+CESL(HH)', and 'eSiGe+CESL(LH)' illustrated in FIG. 8 to the noise power measurements of a reference analog PMOS transistor comprising an NESL with a low hydrogen concentration. As can be seen in FIG. 9, the relative measurement of the noise power of a strained-channel PMOS transistor with a compressively strained channel as compared to the noise power of a reference unstrained-channel analog PMOS transistor comprising an NESL with a low hydrogen concentration is less than 1 regardless of the type of ESL included in the strained-channel PMOS transistor and the hydrogen concentration of the ESL of the strained-channel PMOS transistor.

Figure 10:
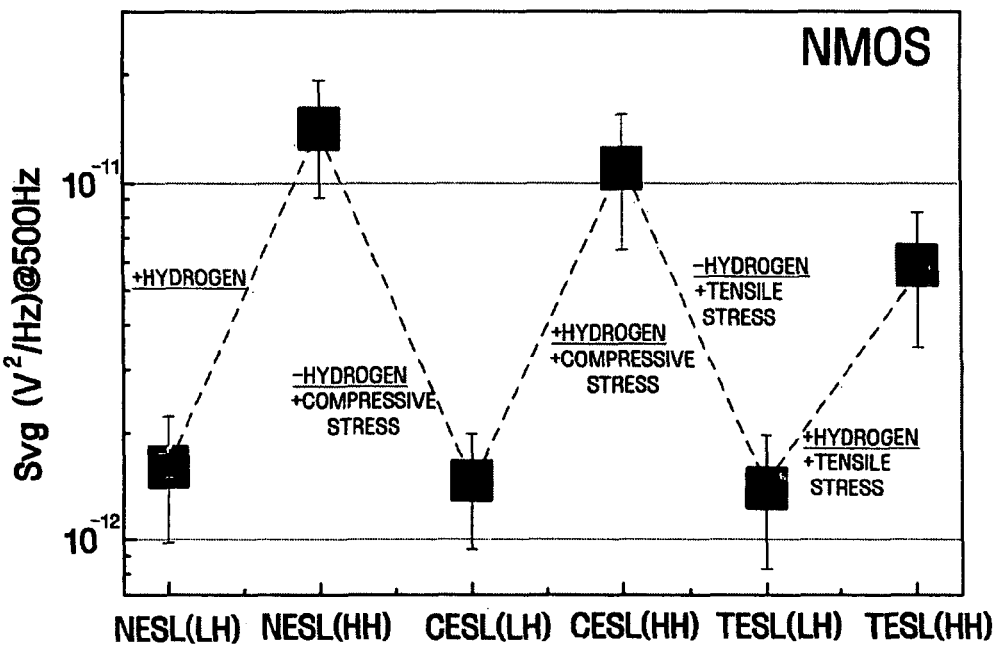

FIG. 10 illustrates a graph of noise power measurements for various transistor types at a frequency of 500 Hz. In particular, a noise power measurement is shown for an analog NMOS transistor NESL(LH) comprising an NESL with a low hydrogen concentration and for an analog NMOS transistor NESL(HH) comprising an NESL with a high hydrogen concentration. Also shown are noise power measurements of an analog NMOS transistor CESL(LH) comprising a CESL with a low hydrogen concentration and for an analog NMOS transistor CESL(HH) comprising a CESL with a high hydrogen concentration. Noise power measurements of an analog NMOS transistor TESL(LH) comprising a tensile ESL (TESL) with a low hydrogen concentration and for an analog NMOS transistor TESL(HH) comprising a TESL with a high hydrogen concentration are also shown in FIG. 10. The analog NMOS transistors NESL(LH), CESL(LH), and TESL (LH) have improved noise characteristics over the analog NMOS transistors NESL(HH), CESL(HH), and TESL(HH). However, the analog NMOS transistors CESL(LH) and CESL(HH) have almost the same noise characteristics as the analog NMOS transistors NESL(LH) and NESL(HH), respectively. Thus, it can be concluded that the noise power of an analog NMOS transistor is affected more by the hydrogen concentration of an ESL than by compressive strain. In addition, given that the analog NMOS transistor TESL(LH) has slightly improved noise characteristics over the analog NMOS transistor NESL(LH), it can be concluded that the noise characteristics of an analog NMOS transistor can be improved by inducing tensile strain. However, given that the noise characteristics of the analog NMOS transistor TESL (HH) are worse than the noise characteristics of the analog NMOS transistor NESL(LH), it can be concluded that the noise power of an analog NMOS transistor is affected more by the hydrogen concentration of an ESL than by tensile strain.

Figure 11:
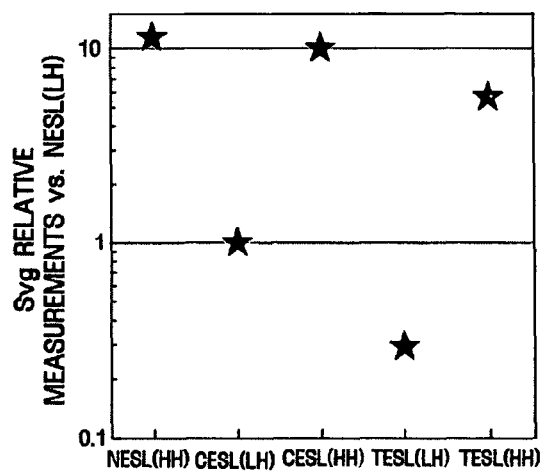

FIG. 11 illustrates a graph between the relative measurements of the noise power measurements of the analog NMOS transistors NESL(HH), CESL(LH), CESL(HH), TESL(LH), and TESL(LH) illustrated in FIG. 10 to noise power measurements of a reference analog NMOS transistor comprising an NESL with a low hydrogen concentration. The hydrogen concentration of an ESL must be maintained relatively low (less than $1\times10^{21}/cm^3$) in order to maintain the noise power of an analog NMOS transistor to the noise power of a reference analog NMOS transistor comprising an NESL with a low hydrogen concentration to be less than 1. Thus, a semiconductor device comprising a combination of one of the PMOS transistors 2100 of FIG. 2 and one of the NMOS transistors 3100, 4100, and 5100 of FIGS. 3, 4, and 5, is based on the experimental results illustrated in FIGS. 6-11. This semiconductor device is expected to achieve synergies by improving both operating and noise characteristics.

Referring back to FIG. 2, the strained-channel analog PMOS transistors 2100 are not affected by the hydrogen concentration levels of the second ESLs 152b and 352b. However, the strained-channel analog PMOS transistors 2100 can induce compressive strain in their respective channels to achieve synergies by improving both operating and noise characteristics. In particular, the PMOS transistor 2100a of FIG. 2 is a strained-channel PMOS transistor including an NESL 152b that does not induce compressive strain in channel 104b, a compressive epitaxial semiconductor layer 124b (e.g., a SiGe layer) which fills a groove in substrate 100 and source/drain regions 128b that induces compressive strain in channel 104b. The PMOS transistor 2100b of FIG. 2 is a strained-channel PMOS transistor including a CESL 352b that induces compressive strain in channel 104b. The PMOS transistor 2100c of FIG. 2 is a strained-channel PMOS transistor including a CESL 152b and a compressive epitaxial semiconductor layer 124b which induces compressive strain in channel 104 together with CESL 152b.

Referring back to FIGS. 3-5 and the NMOS transistors 3100, 4100, and 5100, the hydrogen concentration of the first ESLs 152a, 252a, and 352a is maintained low, for example less than $1\times10^{22}/cm^3$ and specifically less than $1\times10^{21}/cm^3$. This is maintained regardless of whether first ESLs 152a, 252a, and 352a induce strain in respective corresponding channels. When applying these parameters to the fabrication of semiconductor devices along with PMOS transistors 2100, the NMOS transistors 3100, 4100, and 5100 can achieve synergies by improving both the operating and noise characteristics.

The NMOS transistors 3100a, 3100b and 3100c shown in FIG. 3 all include an NESL 152a with a low hydrogen concentration. More specifically, the NMOS transistor 3100a is an unstrained-channel NMOS transistor including an NESL 152a, the NMOS transistor 3100b is a strained-channel NMOS transistor including a tensile epitaxial semiconductor layer 124a (e.g., a SiC layer) which fills a groove in the substrate 100, source/drain regions 128a and induces tensile strain in channel 104a. The NMOS transistor 3100c is a strained-channel NMOS transistor including a compressively strained gate 120' which induces tensile strain in channel 104a. A strained-channel NMOS transistor (not shown) including both the tensile epitaxial semiconductor layer 124a and the compressively strained gate 120' can be derived from the combination of the distinctive features of NMOS transistors 3100b and 3100c and is within the scope of the present invention.

The NMOS transistors 4100a, 4100b, and 4100c shown in FIG. 4 all include a TESL 252a with a low hydrogen concentration. More specifically, NMOS transistor 4100a is a strained-channel NMOS transistor including a TESL 252a which induces tensile strain in channel 104a. NMOS transistor 4100b is a strained-channel NMOS transistor including TESL 252a, a tensile epitaxial semiconductor layer 124a (e.g., a SiC layer) which fills a groove in the substrate 100, source/drain regions 128b, and induces tensile strain in channel 104a together with TESL 252a. NMOS transistor 4100c is a strained-channel NMOS transistor including TESL 252a and a compressively strained gate 120' which induces tensile strain in channel 104a along with TESL 252a. A strained-channel NMOS transistor (not shown) including TESL 252a, tensile epitaxial semiconductor layer 124a, and the compressively strained gate 120' can be derived from the combination of the distinctive features of the NMOS transistors 4100b and 4100c, and is considered within the scope of the present invention.

NMOS transistors 5100a, 5100b, and 5100c shown in FIG. 5 all include a CESL 352a with a low hydrogen concentration. More specifically, NMOS transistor 5100a is a strained-channel NMOS transistor including a CESL 352a which induces compressive strain in channel 104a. NMOS transistor 5100b is a strained-channel NMOS transistor including CESL 352a, tensile epitaxial semiconductor layer 124a (e.g., a SiC layer) which fills a groove in substrate 100 and source/drain regions 128a which induces compressive strain in channel 104a along with CESL 352a. NMOS transistor 5100c is a strained-channel NMOS transistor including CESL 352a and a compressively strained gate 120' which induces compressive strain along with CESL 352a. A strained-channel NMOS transistor (not shown) including CESL 352a, the tensile epitaxial semiconductor layer 124a, and the compressively strained gate 120' can be derived from the combination of the distinctive features of NMOS transistors 5100b and 5100c and is considered within the scope of the present invention.

If a semiconductor device according to an embodiment of the present invention is a system LSI device fabricated by mounting both digital circuits and analog circuits on a single chip for the purpose of providing a single complete system, the semiconductor device may include both an analog circuit region and a digital circuit region. In this manner, the analog circuit region may include the PMOS transistors 2100 shown in FIG. 2 and the NMOS transistors 3100 of FIG. 3, 4100 of FIG. 4, and 5100 of FIG. 5. The digital circuit region may include strained- or unstrained-channel digital NMOS transistors and/or strained- or unstrained-channel digital PMOS transistors according to the level of performance required by a system LSI.

Figure 12A:
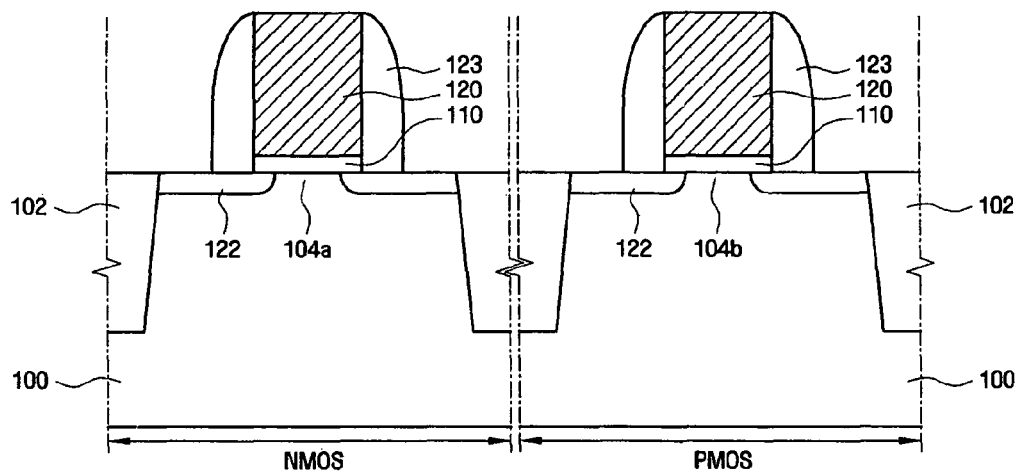
FIGS. 12A-12E illustrate cross-sectional views for explaining a method of fabricating a semiconductor device.

A method of fabricating the PMOS transistor 2100c illustrated in FIG. 2 and the NMOS transistor 4100b illustrated in FIG. 4 is described herein with reference to FIGS. 12A-12E. Referring to FIG. 12A, STIs 102 are formed in a digital and analog circuit region of a semiconductor substrate 100, e.g., a silicon substrate. Channel ion implantation is performed on the semiconductor substrate 100 using appropriate ions for the type of transistors to be formed in each region. An insulation layer and a conductive layer are then formed on the semiconductor substrate 100 and are patterned into gate insulation layers 110 and gates 120. Thereafter, source/drain extension regions 122 are formed which define channels 104a and 104b. Insulation spacers 123 are formed on the sidewalls of each of gates 120.

Figure 12B:
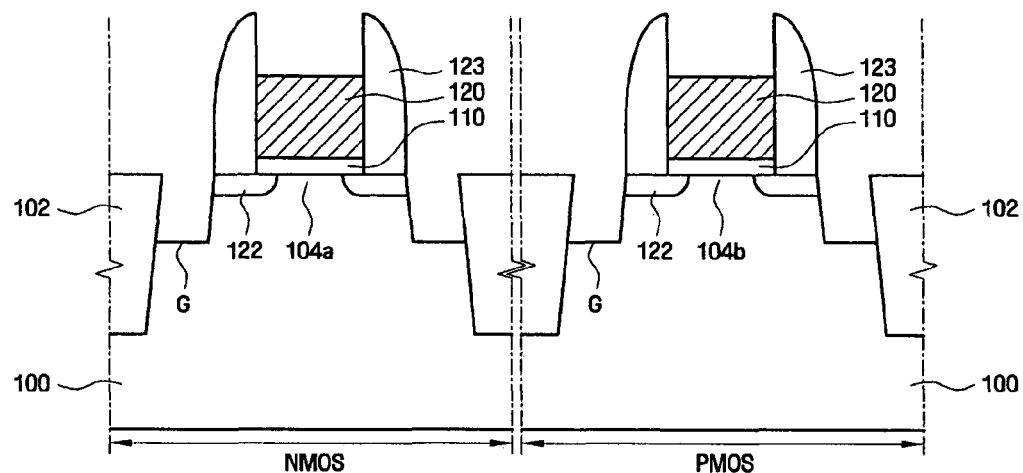

Referring to FIG. 12B, grooves G which are filled with epitaxial semiconductor layers 124a and 124b that induce strain in the channels 104a and 104b, respectively, are formed by partially etching semiconductor substrate 100. The gates 120 may be partially etched during the formation of grooves G.

Figure 12C:
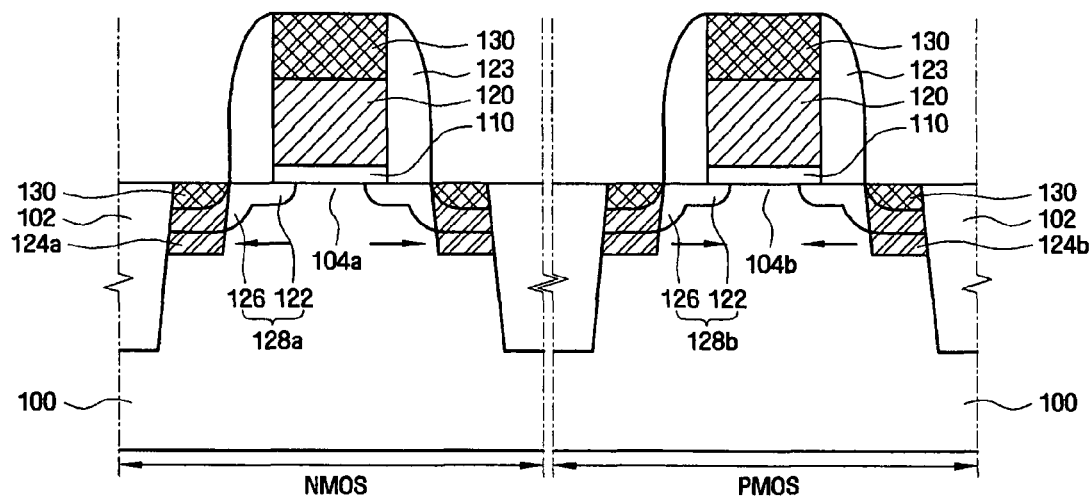

Referring to FIG. 12C, epitaxial semiconductor layers 124a and 124b are formed so that each of grooves G can be filled with one of the epitaxial semiconductor layers 124a and 124b. A SiC layer that induces tensile strain in channel 104b may be formed in an NMOS region. A SiGe layer that induces compressive strain in channel 104b may be formed in a PMOS region. The epitaxial semiconductor layers 124a and 124b may be formed using a selective epitaxial growth (SEG) method, for example, a low pressure chemical vapor deposition (LPCVD) method or an ultra-high vacuum chemical vapor deposition (UHC CVD) method. During the formation of epitaxial semiconductor layers 124a and 124b, an in-situ doping operation may be performed using dopants used to form deep source/drain regions 126. The epitaxial semiconductor layers 124a and 124b may be formed using, for example, Si2H6, SiH4, SiH2Cl2, SiHCl3, or SiCl4 as a Si source, GeH4 as a Ge source, and C2H6 or CH3SiH3 as a C source. In order to enhance the selective characteristics of epitaxial semiconductor layers 124a and 124b, a HCl or Cl2 gas may be added to the sources. A B2H6, PH3, or AsH3 gas may also be added to the sources to dope epitaxial semiconductor layers 124a and 124b. By adding a HCl gas, it is possible to selectively form the epitaxial semiconductor layers 124a and 124b only in regions where Si is exposed using an SEG method while preventing the growth of the epitaxial semiconductor layers 124a and 124b in STIs 102.

After the formation of epitaxial semiconductor layers 124a and 124b, deep source/drain regions 126 are formed. As a result, the formation of n-type source/drain regions 128a and p-type source/drain regions 128b are complete. If a doping operation is performed during an epitaxial growth operation for forming epitaxial semiconductor layers 124a and 124b, the deep source/drain regions 126b may not be formed. Thereafter, a silicide layer 130 is formed on gates 120 and on source/drain regions 128a and 128b using a silicide process.

Figure 12D:
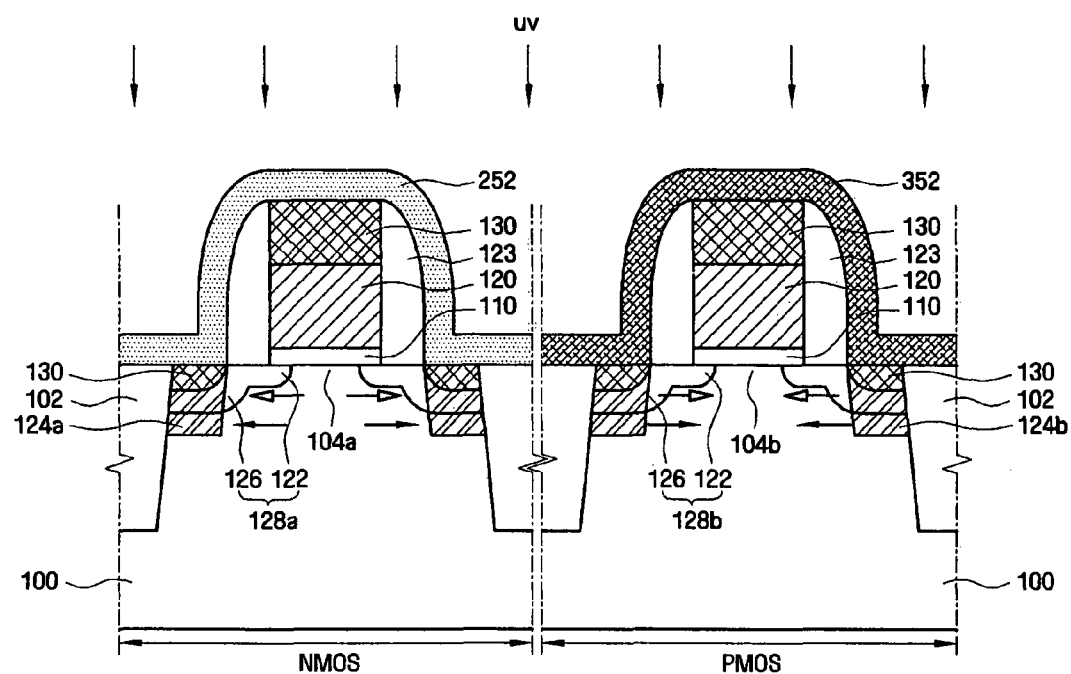
Figure 12E:
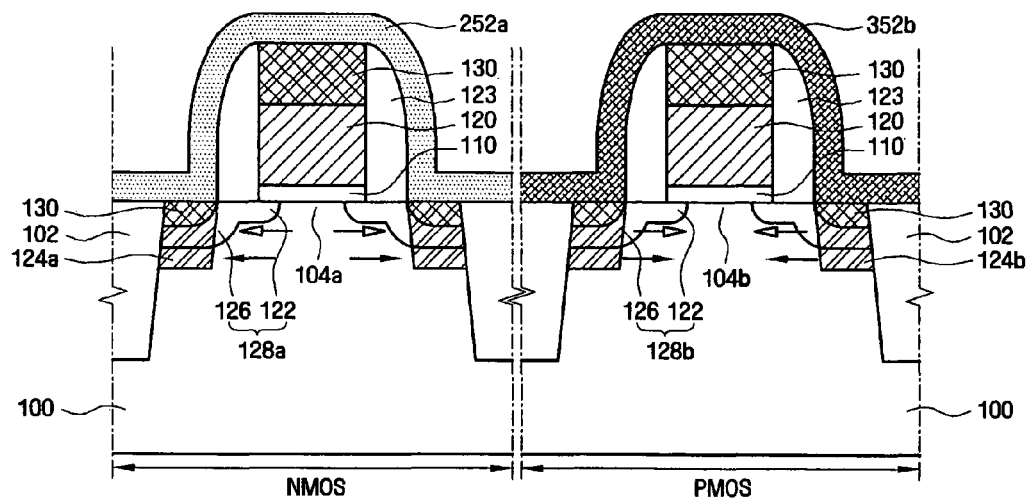
Figure 13:
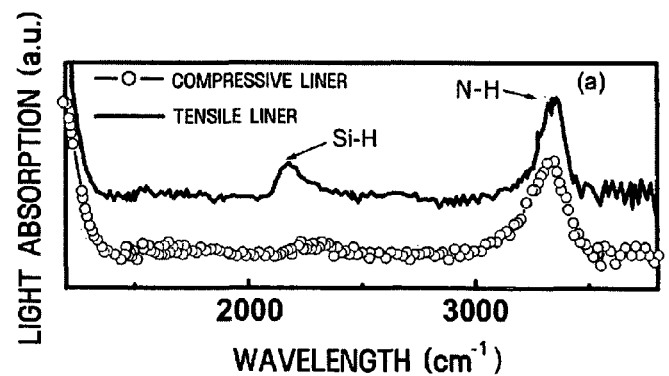
FIG. 13 illustrates a graph of a relationship between infrared (IR) measurements of the hydrogen concentration of compressive strain-induced SiON layers and IR measurements of the hydrogen concentration of tensile strain-induced SiON layers.

Referring to FIG. 12D, a tensile strain liner 252 and a compressive strain liner 352 are formed. Tensile strain liner 252 covers an NMOS transistor and compressive strain liner 352 covers a PMOS transistor. The tensile strain liner 252 and the compressive strain liner 352 may be formed of different materials or may be formed of the same material, but under different processing conditions as is well known in the art. If tensile strain liner 252 is formed using a SiON layer, the hydrogen concentration of the tensile strain liner 252 may exceed $1 \times 10^{21}/cm^3$, as illustrated in FIG. 13. The hydrogen concentration of tensile strain liner 252 may be higher than the hydrogen concentration of compressive strain liner 352. In order to improve the flicker noise characteristics of an analog NMOS transistor, the hydrogen concentration of tensile strain liner 252 must be reduced by, for example, the use of ultraviolet (UV) rays irradiated for about 1 to 10 minutes. As a result of UV irradiation, the hydrogen concentration of compressive strain liner 352 may also be reduced. By utilizing the method illustrated in FIGS. 12A-12D, a semiconductor device having NMOS and PMOS transistors with improved operating and flicker noise characteristics illustrated in FIG. 12E can be obtained.

After the formation of an NMOS transistor and a PMOS transistor, the method illustrated in FIG. 12A-12E may also include forming interconnections so that electrical signals can be input and output from the NMOS and PMOS transistors, forming a passivation layer on substrate 100 and associated packaging substrate. The semiconductor device may be fabricated using the methods described above with reference to FIGS. 12A-12E, where the formation of epitaxial semiconductor layers 124a and 124b may be optional. In addition various combinations of analog transistors may be fabricated by forming first and second ESLs with desired strain inducing characteristics on NMOS and PMOS transistors as described above with reference to FIGS. 2-5.

Figure 14:
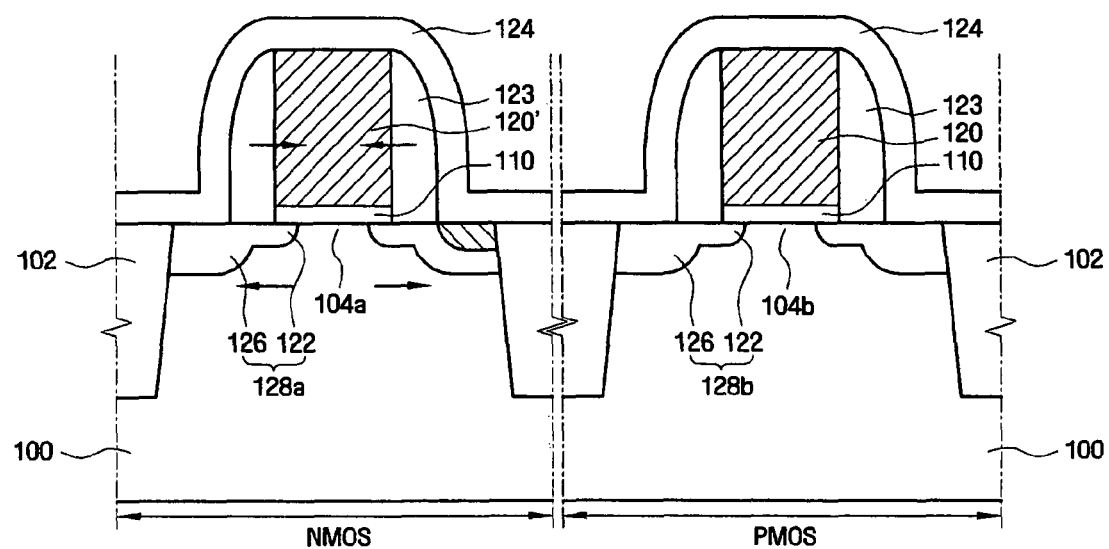
FIG. 14 illustrates a cross-sectional view for explaining a method of fabricating a semiconductor device including an NMOS device with channels that are tensilely strained by a compressively strained gate, according to an embodiment of the present invention.

FIG. 14 illustrates a cross-sectional view to explain the method of forming a compressively strained gate 120' that induces tensile strain in channel 104a of an NMOS transistor. Source/drain regions 128a and 128b are formed in semiconductor substrate 100 and a gate transformation layer 124 is formed on the entire surface of semiconductor substrate 100. Annealing is performed on semiconductor substrate 100 so that compressive strain is applied to gates 120 formed of polysilicon. As a result, a compressively strained gate 120' having a transformed upper portion is formed in an NMOS region. The type of gate transformation layer 124 and the formation of compressively strained gate 120' are disclosed in K. Ota et al., "Novel Locally Strained Channel Technique for High Performance 55 nm CMOS," International Electron Devices Meeting, 2.2.1, IEEE, February 2002, and Chien-Hao Chen et al., "Stress Memorization Technique (SMT) by Selectively Strained-Nitride Capping for Sub-65 nm High-Performance Strained-Si Device Application," VLSI Technology, 2004, the disclosures of which are incorporated herein by reference. After the formation of compressively strained gate 120', gate transformation layer 124 is removed and the processes described above with reference to FIGS. 12B-12D are performed to complete fabrication of the semiconductor device.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor device comprising:
    an analog NMOS transistor disposed on a substrate;
    a compressively-strained-channel analog PMOS transistor disposed on the substrate;
    a first etch stop liner (ESL) covering the analog NMOS transistor and having a hydrogen concentration of less than $1\times10^{21}/cm^3$; and
    a second ESL covering the compressively-strained-channel analog PMOS transistor, wherein the second ESL is a compressive strain liner,
    wherein relative measurements of flicker noise power for the analog NMOS transistor and the compressively-strained-channel analog PMOS transistor, as compared to corresponding measurements of flicker noise power for a reference unstrained-channel analog NMOS and PMOS transistors, respectively at a frequency of 500 Hz is less than 1, and
    the reference unstrained-channel analog NMOS and PMOS induce a stress of less than $\pm|2|$ Gdyne/cm$^2$.

2. The semiconductor device of claim 1, wherein the second ESL is a neutral ESL, the device further comprising:
    a compressive epitaxial semiconductor layer filling a groove formed in the substrate; and
    source/drain regions formed in the compressive epitaxial semiconductor layer.

3. The semiconductor device of claim 1, wherein the second ESL is a compressive strain liner, such that a compressive stress is induced in a channel of the compressively-strained-channel PMOS transistor by the second ESL.

4. The semiconductor device of claim 3, wherein the compressively-strained-channel PMOS transistor comprises a compressive epitaxial semiconductor layer, such that the compressive epitaxial semiconductor layer induces the compressive strain in the channel of the compressively-strained-channel PMOS transistor, fills a groove formed in the substrate, and comprises source/drain regions.

5. The semiconductor device of claim 1, wherein the first ESL is a neutral ESL, and the analog NMOS transistor is a strained-channel NMOS transistor comprising:
    a tensile epitaxial semiconductor layer filling a groove formed in the substrate; and
    source/drain regions formed in the tensile epitaxial semiconductor layer;
    wherein the combination of the tensile epitaxial semiconductor layer and source/drain regions induces a tensile strain in a channel of the strained-channel NMOS transistor.

6. The semiconductor device of claim 1, wherein the first ESL is a neutral ESL, and the analog NMOS transistor is a strained-channel NMOS transistor comprising, a compressively strained gate inducing a tensile strain in the channel of the strained-channel NMOS transistor.

7. The semiconductor device of claim 1, wherein the first ESL is a tensile strain liner, and the analog NMOS transistor is a strained-channel NMOS transistor comprising a channel strained by the tensile strain liner.

8. The semiconductor device of claim 7, wherein the strained-channel NMOS transistor further comprises:
    a tensile epitaxial semiconductor layer filling a groove formed in the substrate; and
    source/drain regions formed in the tensile epitaxial semiconductor layer;
    wherein a combination of the tensile epitaxial semiconductor layer and source/drain regions induces a tensile strain in a channel of the strained-channel NMOS transistor.

9. The semiconductor device of claim 7, wherein the strained-channel NMOS transistor further comprises a compressively strained gate further inducing the tensile strain in the channel of the strained-channel NMOS transistor.

10. The semiconductor device of claim 1, wherein the first ESL is a compressive strain liner and the analog NMOS transistor is a strained-channel NMOS transistor comprising a channel compressively strained by the compressive strain liner.

11. The semiconductor device of claim 10, wherein the strained-channel NMOS transistor comprises;
    a tensile epitaxial semiconductor layer filling a groove formed in the substrate; and
    source/drain regions formed in the tensile epitaxial semiconductor layer;
    wherein a combination of the tensile epitaxial semiconductor layer and source/drain regions induces a tensile strain in a channel of the strained-channel NMOS transistor.

12. The semiconductor device of claim 10, wherein the strained-channel NMOS transistor comprises a compressively strained gate inducing a tensile strain in the channel of the strained-channel NMOS transistor.

* * * * *